United States Patent
Lin et al.

(10) Patent No.: US 10,643,698 B2
(45) Date of Patent: May 5, 2020

(54) OPERATING METHOD OF RESISTIVE MEMORY STORAGE APPARATUS

(71) Applicant: Winbond Electronics Corp., Taichung (TW)

(72) Inventors: Lih-Wei Lin, Taichung (TW);
Ju-Chieh Cheng, Taichung (TW);
Tsung-Huan Tsai, Taichung (TW);
I-Hsien Tseng, Taichung (TW)

(73) Assignee: Windbond Electronics Corp., Taichung (TW)

( * ) Notice: Subject to any disclaimer, the term of this patent is extended or adjusted under 35 U.S.C. 154(b) by 102 days.

(21) Appl. No.: 16/103,942

(22) Filed: Aug. 15, 2018

(65) Prior Publication Data
US 2020/0027507 A1 Jan. 23, 2020

(30) Foreign Application Priority Data

Oct. 11, 2017 (CN) .............................. 2017 0 940029

(51) Int. Cl.
*G11C 13/00* (2006.01)
*G11C 5/14* (2006.01)

(52) U.S. Cl.
CPC .......... *G11C 13/0097* (2013.01); *G11C 5/147* (2013.01); *G11C 13/0026* (2013.01); *G11C 13/0038* (2013.01)

(58) Field of Classification Search
None
See application file for complete search history.

(56) References Cited

U.S. PATENT DOCUMENTS

| | | |
|---|---|---|
| 9,691,980 B1 | 6/2017 | Lin et al. |
| 2012/0230085 A1* | 9/2012 | Kawai ................... H01L 27/101 365/148 |
| 2013/0044534 A1* | 2/2013 | Kawai ................ G11C 13/0007 365/148 |
| 2013/0148408 A1* | 6/2013 | Kawai ................ G11C 13/0007 365/148 |
| 2014/0185360 A1* | 7/2014 | Kawai ................ G11C 13/0007 365/148 |
| 2014/0269004 A1 | 9/2014 | Pramanik et al. |
| 2015/0279479 A1 | 10/2015 | Li et al. |
| 2016/0093398 A1 | 3/2016 | Choi et al. |
| 2016/0379708 A1* | 12/2016 | Katayama ........... G11C 11/1653 365/148 |

FOREIGN PATENT DOCUMENTS

| | | |
|---|---|---|
| CN | 205177408 | 4/2016 |
| TW | 580707 | 3/2004 |

* cited by examiner

*Primary Examiner* — Tan T. Nguyen
(74) *Attorney, Agent, or Firm* — JCIPRNET (57) ABSTRACT

An operating method of a resistive memory storage apparatus includes: applying a forming voltage to a memory cell and obtaining a cell current of the memory cell; and determining whether to adjust the forming voltage and apply the adjusted forming voltage to the memory cell according to a magnitude relationship between the cell current and a reference current. The memory cell to which the forming voltage is applied operates in a heavy forming mode and serves as a one-time programmable memory device.

10 Claims, 5 Drawing Sheets

Apply a forming voltage to a memory cell and obtain a first cell current of the memory cell — S100

Determine whether to adjust the forming voltage and apply the adjusted forming voltage to the memory cell according to a magnitude relationship between the first cell current and a first reference current — S110

OPERATING METHOD OF RESISTIVE MEMORY STORAGE APPARATUS

CROSS-REFERENCE TO RELATED APPLICATION

This application claims the priority benefit of China application serial no. 201710940029.1, filed on Oct. 11, 2017. The entirety of the above-mentioned patent application is hereby incorporated by reference herein and made a part of this specification.

BACKGROUND

Field of the Invention

The invention relates to an operating method of a memory storage apparatus, particularly to an operating method of a resistive memory storage apparatus.

Description of Related Art

In current technology, after setting of the current resistive memory is completed, although a memory cell in a low resistance state (LRS) can be obtained and a read current thereof is large, it is unknown from the large read current whether the filament of the LRS memory cell is strong enough to pass high temperature data retention (HTDR) and endurance tests. By contrast, after reset of the current resistive memory is completed, although a memory cell in a high resistance state (HRS) can be obtained and a read current thereof is small, it is unknown from the small read current whether the filament of the HRS memory cell is strong enough to pass the HTDR and endurance tests. A memory cell that cannot pass the HTDR and endurance tests fails to provide high reliability and is thus not suitable for serving as a one-time programmable (OTP) memory device.

SUMMARY OF THE INVENTION

The invention provides an operating method of a resistive memory storage apparatus, in which a memory cell has high reliability and is suitable for serving as a one-time programmable memory device.

The operating method of a resistive memory storage apparatus of the invention includes the following. A forming voltage is applied to a memory cell and a first cell current of the memory cell is obtained. Whether to adjust the forming voltage and apply the adjusted forming voltage to the memory cell is determined according to a magnitude relationship between the first cell current and a first reference current. The memory cell to which the forming voltage is applied operates in a heavy forming mode and serves as a one-time programmable memory device.

In an embodiment of the invention, the operating method of a resistive memory storage apparatus further includes the following. Whether the first cell current is smaller than the first reference current is determined. If the first cell current is smaller than the first reference current, the forming voltage is adjusted and the adjusted forming voltage is applied to the memory cell. If the first cell current is greater than or equal to the first reference current, the operating method is ended.

In an embodiment of the invention, the operating method of a resistive memory storage apparatus further includes the following. The steps of adjusting the forming voltage and applying the adjusted forming voltage to the memory cell are repeated until the first cell current becomes greater than or equal to the first reference current.

In an embodiment of the invention, the forming voltage includes a gate voltage and a bit line voltage. The step of applying the forming voltage to the memory cell includes the following. The gate voltage and the bit line voltage are applied respectively to a gate of the memory cell and a bit line coupled to the gate of the memory cell. Voltage values of the gate voltage and the bit line voltage are determined according to a material of a dielectric layer of the memory cell.

In an embodiment of the invention, the operating method of a resistive memory storage apparatus further includes the following. A reset operation is performed on the memory cell operating in the heavy forming mode. The memory cell on which the reset operation has been performed operates in the heavy forming mode and serves as a multiple-time programmable (MTP) memory device.

In an embodiment of the invention, the operating method of a resistive memory storage apparatus further includes the following. A second cell current of the memory cell is obtained. Whether to perform the reset operation on the memory cell operating in the heavy forming mode is determined according to a magnitude relationship between the second cell current and a second reference current. The step of determining whether to perform the reset operation on the memory cell operating in the heavy forming mode according to the magnitude relationship between the second cell current and the second reference current includes the following. Whether the second cell current is smaller than the second reference current is determined. If the second cell current is smaller than the second reference current, the reset operation is not performed on the memory cell operating in the heavy forming mode and the operating method is ended. If the second cell current is greater than or equal to the second reference current, the reset operation is performed on the memory cell operating in the heavy forming mode.

In an embodiment of the invention, the reset operation includes the following. A source line voltage of the memory cell is set, a reset voltage and the source line voltage are applied respectively to the gate of the memory cell and a source line coupled to the gate of the memory cell, and a first reset current of the memory cell is obtained. The source line voltage of the memory cell is adjusted, the reset voltage and the adjusted source line voltage are applied respectively to the gate of the memory cell and the source line coupled to the gate of the memory cell, and a second reset current of the memory cell is obtained. Whether to adjust the source line voltage of the memory cell again or record a current value of the second reset current is determined according to a magnitude relationship between the first reset current and the second reset current. The step of determining whether to adjust the source line voltage of the memory cell again or record the current value of the second reset current according to the magnitude relationship between the first reset current and the second reset current includes the following. Whether the second reset current is smaller than the first reset current is determined. If the second reset current is smaller than the first reset current, the current value of the second reset current is recorded. If the second reset current is equal to the first reset current, the source line voltage of the memory cell is adjusted again.

In an embodiment of the invention, if the second reset current is equal to the first reset current, the source line voltage of the memory cell is adjusted again, and the step of applying the reset voltage and the adjusted source line voltage respectively to the gate of the memory cell and the source line coupled to the gate of the memory cell is repeated until the second reset current becomes smaller than the first reset current.

In an embodiment of the invention, the operating method of a resistive memory storage apparatus further includes the following. After the current value of the second reset current is recorded, the source line voltage of the memory cell is adjusted again, the reset voltage and the adjusted source line voltage are applied respectively to the gate of the memory cell and the source line coupled to the gate of the memory cell, and a third reset current of the memory cell is obtained. Whether to adjust the source line voltage of the memory cell again or end the reset operation is determined according to a magnitude relationship between the second reset current and the third reset current. The step of determining whether to adjust the source line voltage of the memory cell again or end the reset operation according to the magnitude relationship between the second reset current and the third reset current includes the following. Whether the third reset current is greater than or equal to the second reset current is determined. If the third reset current is greater than or equal to the second reset current, the reset operation is ended. If the third reset current is smaller than the second reset current, the source line voltage of the memory cell is adjusted again.

In an embodiment of the invention, if the third reset current is smaller than the second reset current, the source line voltage of the memory cell is adjusted again, and the step of applying the reset voltage and the adjusted source line voltage respectively to the gate of the memory cell and the source line coupled to the gate of the memory cell is repeated until the third reset current becomes greater than or equal to the second reset current.

Based on the above, in exemplary embodiments of the invention, the memory cell to which the forming voltage is applied operates in the heavy forming mode, has high reliability, and is suitable for serving as a one-time programmable memory device.

To make the above features and advantages of the invention more comprehensible, several embodiments accompanied with drawings are described in detail as follows.

DETAILED DESCRIPTION OF DISCLOSED EMBODIMENTS

Figure 1:
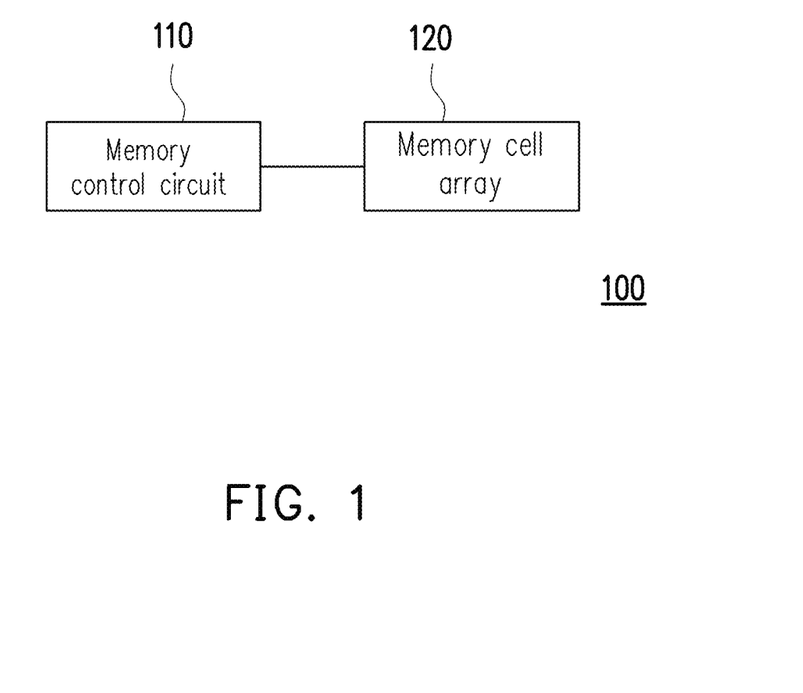
FIG. 1 illustrates a schematic view of a memory storage apparatus according to an embodiment of the invention.

FIG. 1 illustrates a schematic view of a memory storage apparatus according to an embodiment of the invention.

Figure 2:
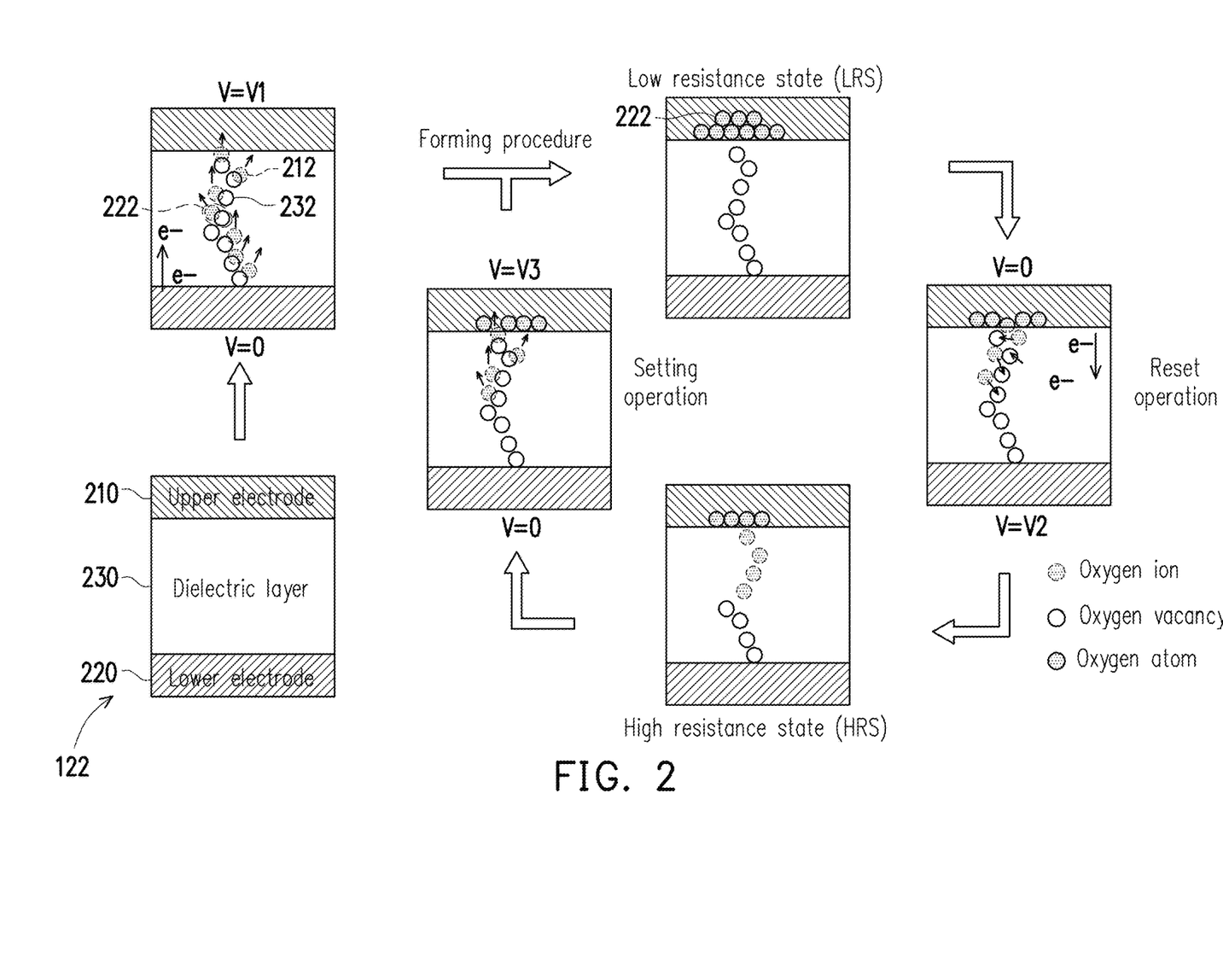
FIG. 2 illustrates a schematic view of a filament in a memory cell that undergoes a forming procedure, a reset operation and a setting operation, according to a related art of the invention.

FIG. 2 illustrates a schematic view of a filament in a memory cell that undergoes a normal forming procedure, a normal reset operation and a normal setting operation, according to a related art of the invention. Referring to FIG. 1 and FIG. 2, a memory storage apparatus 100 of this related art includes a memory control circuit 110 and a memory cell array 120. The memory cell array 120 is coupled to the memory control circuit 110. The memory cell array 120 includes a plurality of memory cells 122 arranged in an array. In this related art, the memory cell 122 includes an upper electrode 210, a lower electrode 220 and a dielectric layer 230. The upper electrode 210 and the lower electrode 220 are good metal conductors, and may be of the same or different materials. The dielectric layer 230 is disposed between the upper electrode 210 and the lower electrode 220. The dielectric layer 230 includes a dielectric material such as a transition metal oxide (TMO). The memory cell 122 of such structure at least has two resistance states, and the resistance state of the memory cell 122 is changed by applying different voltages to the electrodes on both ends thereof, so as to provide a data storage function.

In the present embodiment, the memory cell 122 has, for example, a structure including one transistor and one resistor (1T1R), or a structure including two transistors and two resistors (2T2R); regarding an implementation manner thereof, sufficient teaching, suggestion, and implementation illustration can be obtained from common knowledge in the art. The invention does not limit the structure of the memory cell 122.

In this related art, the memory control circuit 110 is configured to perform a normal forming procedure on the memory cell 122. Said normal forming procedure means a process of initializing the memory cell 122. During this process, a bias voltage (forming voltage) V1 is continuously applied to the electrodes on both ends of the memory cell 122 so as to generate an external electric field on the dielectric layer 230. In this related art, a positive voltage of V1 volt is applied to the upper electrode 210 and a voltage of 0 volt is applied to the lower electrode 220. The external electric field separates oxygen atoms 222 into oxygen ions 212 and oxygen vacancies 232. The oxygen vacancies 232 form a filament in the dielectric layer 230 to serve as a current transmission path. When the external electric field exceeds a threshold value, the dielectric layer 230 undergoes dielectric breakdown and thus changes from a high resistance state (HRS) to a low resistance state (LRS). This kind of breakdown is not permanent and the resistance thereof can still be changed.

The memory cell 122 that has undergone the normal forming procedure is in the low resistance state. In a normal reset operation, a voltage of 0 volt is applied to the upper electrode 210 of the memory cell 122, and a positive voltage of V2 volt is applied to the lower electrode 220 of the memory cell 122. A voltage difference value between them is a normal reset voltage and is, for example, −V2 volt. The memory cell 122 that has undergone the normal reset operation changes from the low resistance state to the high resistance state. Next, in a normal setting operation, a positive voltage of V3 volt is applied to the upper electrode 210 of the memory cell 122, and a voltage of 0 volt is applied to the lower electrode 220 of the memory cell 122. A voltage difference value between them is a normal setting voltage and is, for example, +V3 volt. The memory cell 122 that has undergone the normal setting operation changes from the high resistance state to the low resistance state. In this related art, the magnitudes and polarities of the normal reset voltage and the normal setting voltage are only for exemplary purposes and are not intended to limit the invention. In the present embodiment, the forming procedure, the reset operation and the setting operation illustrated in FIG. 2 are only for exemplary purposes and are not intended to limit the invention.

On the other hand, in terms of reliability testing and commercialization, high temperature data retention (HTDR) and endurance of the memory storage apparatus 100 are decisive factors. One of causes of loss of the high temperature data retention of the memory storage apparatus 100 is that, the oxygen ions 212 drift from an electrode layer (e.g., the upper electrode 210) to the dielectric layer 230 to be recombined with the oxygen vacancies 232 therein, which may thus block the current transmission path in the dielectric layer 230, i.e., result in breakage of the filament therein.

Figure 3:
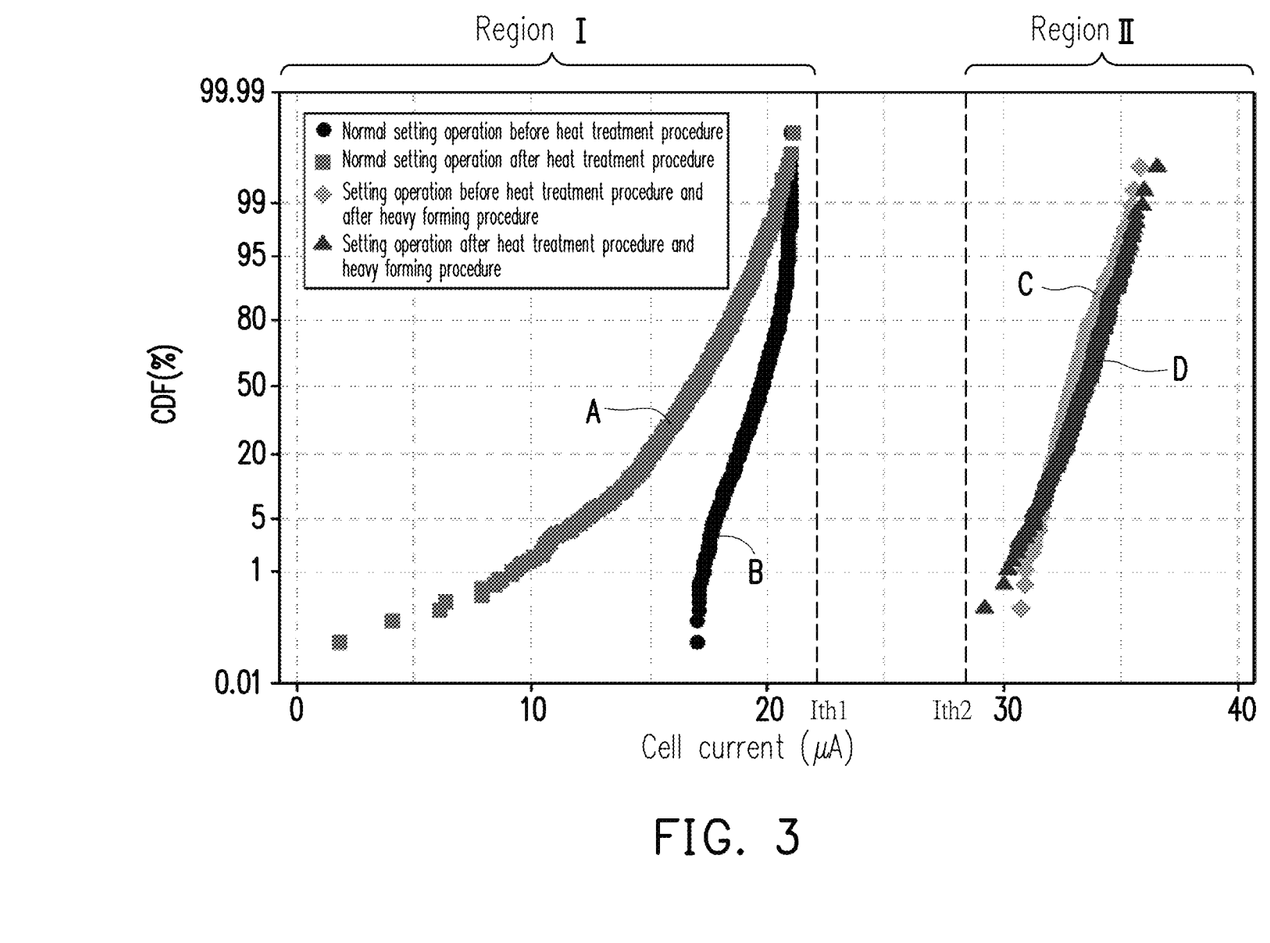
FIG. 3 illustrates a cumulative distribution function (CDF) of a cell current of a memory cell before and after a heat treatment according to an embodiment of the invention.

FIG. 3 illustrates a cumulative distribution function (CDF) of a cell current of a memory cell before and after a heat treatment according to an embodiment of the invention. Referring to FIG. 1 to FIG. 3, in the related art in FIG. 2, after the memory cell 122 undergoes the normal forming procedure, the normal setting operation or the normal reset operation may be performed subsequently to change the resistance state of the memory cell 122, thereby recording written data as logic 1 or logic 0. Said normal forming procedure is, for example, as follows. During the forming procedure, a voltage of 1.5 volt to 2.5 volt (i.e., gate voltage (Vg)=1.5 V to 2.5 V) is applied to a gate of the memory cell 122, and a voltage of greater than 0 volt and smaller than 4 volts (bit line voltage (Vb1)=0 V to 4 V) is applied to a bit line coupled to the gate of the memory cell 122.

In the related art in FIG. 2, the memory cell 122 that has undergone the normal forming procedure has a cell current roughly located in region I in FIG. 3. Region I is a region between when the cell current is 0 and when the cell current is a first threshold current Ith1, the first threshold current Ith1 being about 22 microamperes (μA). Cell current curves A and B of the memory cell 122 operating in region I, which respectively indicate the cell currents before and after a heat treatment procedure, exhibit a significant difference from each other. That is, the high temperature data retention of the memory cell 122 clearly deteriorates.

In an exemplary embodiment of the invention, as compared to the normal forming procedure, the memory control circuit 110 applies a greater forming voltage, for example, a gate voltage Vg of greater than 6.0 V and a bit line voltage Vb1 of greater than 5.0 V, to the memory cell 122 in a heavy forming procedure. In the present embodiment, the voltage values of the gate voltage Vg and the bit line voltage Vb1 are, for example, determined according to the material of the dielectric layer 230 of the memory cell 122. Therefore, in an exemplary embodiment of the invention, the memory cell 122 that has undergone the heavy forming procedure has a cell current roughly located in region II in FIG. 3. Region II is a region between when the cell current is a second threshold current Ith2 and 40 μA, the second threshold current Ith2 being about 27 μA. Cell current curves C and D of the memory cell 122 operating in region II, which respectively indicate the cell currents before and after a heat treatment procedure, are roughly the same. That is, the high temperature data retention of the memory cell 122 substantially remains unchanged, and the memory cell 122 has high reliability. Therefore, in an exemplary embodiment of the invention, the memory cell 122 to which the forming voltage is applied operates in the heavy forming mode (i.e., in region II), and the high temperature data retention of the memory cell 122 remains unchanged. The memory cell 122 has high reliability, and is suitable for serving as a one-time programmable memory device.

In an exemplary embodiment of the invention, the heavy forming mode is, for example, as follows. As compared to the normal forming procedure, the memory control circuit 110 applies a greater forming voltage to the memory cell 122 in the heavy forming procedure, so as to enable the memory cell 122 to operate in region II in which the cell current is greater than the second threshold current. The memory cell 122 that may operate in the heavy forming mode has high reliability and is suitable for serving as a one-time programmable memory device. The various parameters (including gate voltage, bit line voltage, curve and threshold current value) disclosed in the exemplary embodiment of FIG. 3 are only for exemplary purposes and are not intended to limit the invention. Several exemplary embodiments are mentioned below to illustrate an operating method of a resistive memory storage apparatus.

Figure 4:
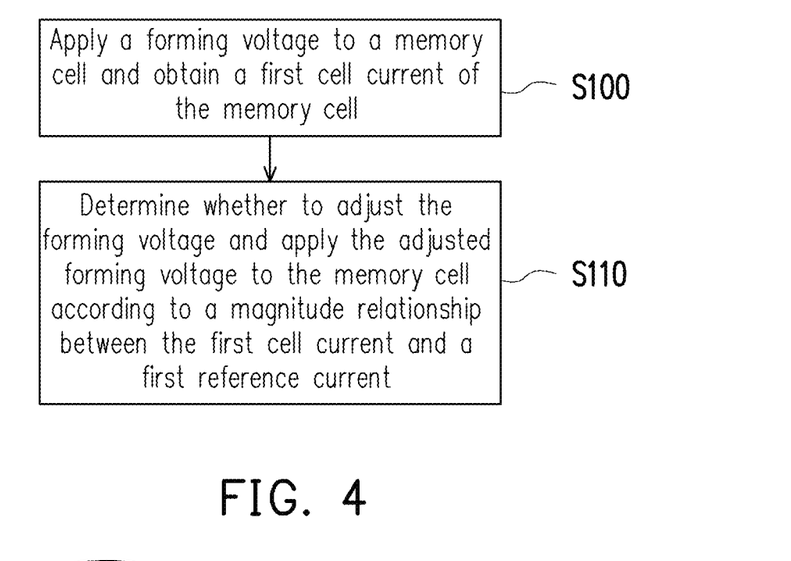
FIG. 4 illustrates a flowchart of an operating method of a memory storage apparatus according to an embodiment of the invention.

FIG. 4 illustrates a flowchart of an operating method of a memory storage apparatus according to an embodiment of the invention. Referring to FIG. 1 and FIG. 4, in the present embodiment, in step S100, the memory control circuit 110 applies a forming voltage to the memory cell 122 and obtains a first cell current of the memory cell 122. In step S100, the forming voltage applied to the memory cell 122 is, for example, a greater forming voltage as compared to the forming voltage of the normal forming procedure. In step S110, the memory control circuit 110 determines whether to adjust the forming voltage and apply the adjusted forming voltage to the memory cell 122 according to a magnitude relationship between the first cell current and a first reference current. In the present embodiment, the memory cell to which the forming voltage is applied or the memory cell to which the adjusted forming voltage is applied may operate in the heavy forming mode, has high reliability and is suitable for serving as a one-time programmable memory device.

Figure 5:
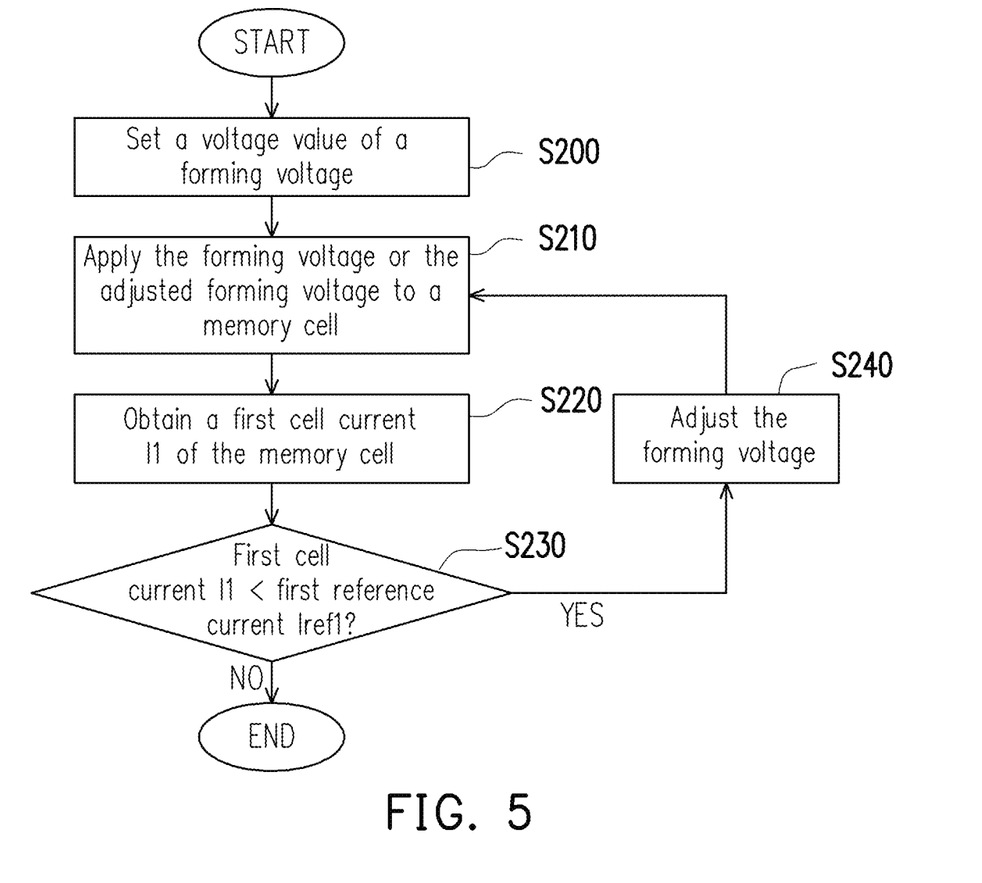
FIG. 5 illustrates a flowchart of an operating method of a memory storage apparatus according to another embodiment of the invention.

FIG. 5 illustrates a flowchart of an operating method of a memory storage apparatus according to another embodiment of the invention. Referring to FIG. 1 and FIG. 5, in the present embodiment, in step S200, the memory control circuit 110 sets a voltage value of the forming voltage. The magnitude of the voltage value of the forming voltage is determined according to, for example, the gate voltage or bit line voltage of the memory cell 122, or a pulse width of the forming voltage. In step S200, the forming voltage set by the memory control circuit 110 is, for example, a greater forming voltage as compared to the forming voltage of the normal forming procedure. In an embodiment, the pulse width of the forming voltage set by the memory control circuit 110 may be the same as or greater than the pulse width of the forming voltage of the normal forming procedure. In step S210, the memory control circuit 110 applies the forming voltage to the memory cell 122. In step S210, the operation of applying the forming voltage to the memory cell 122 is, for example, applying the gate voltage Vg and the bit line voltage Vb1 respectively to the gate of the memory cell 122 and the bit line coupled to the gate of the memory cell 122. In the present embodiment, the voltage values of the gate voltage Vg and the bit line voltage Vb1 are, for example, determined according to the material of the dielectric layer 230 of the memory cell 122. In step S220, the memory control circuit 110 obtains a first cell current I1 of the memory cell 122.

Next, in step S230, the memory control circuit 110 determines whether the first cell current I1 is smaller than a first reference current Iref1. In the present embodiment, the first reference current Iref1 is set to, for example, 35 µA. However, this value is not intended to limit the invention. If the first cell current I1 is greater than or equal to the first reference current Iref1 (i.e., I1≥Iref1), it means that the memory cell to which the forming voltage is applied may operate in the heavy forming mode and is suitable for serving as a one-time programmable memory device. Thus, the memory control circuit 110 ends the operating method of the memory storage apparatus 100.

If the first cell current I1 is smaller than the first reference current Iref1, the memory control circuit 110 performs step S240. In step S240, the memory control circuit 110 adjusts the forming voltage set in step S200 and goes back to step S210 to apply the adjusted forming voltage to the memory cell 122. In the present embodiment, methods of adjusting the forming voltage by the memory control circuit 110 include, for example, stepping the forming voltage, i.e., adjusting the forming voltage into a pulse width signal having a gradually increasing level.

Next, the memory control circuit 110 repeats steps S210 to S240 until the first cell current I1 becomes greater than or equal to the first reference current Iref1, and then ends the operating method of the memory storage apparatus 100. Therefore, the memory cell to which the forming voltage is applied may operate in the heavy forming mode and is suitable for serving as a one-time programmable memory device. In the present embodiment, before performing the operating method, the memory control circuit 110 may also set the number of times of applying the forming voltage to the memory cell 122 as one or more (e.g., five or less), but the number of times is not intended to limit the invention. Thus, the number of times of repeating steps S210 to S240 by the memory control circuit 110 is not more than the set number of times. In an embodiment, the memory control circuit 110 may not repeat steps S210 to S240. That is, the first cell current I1 becomes greater than or equal to the first reference current Iref1 just after the forming voltage is applied for the first time.

Therefore, in the present embodiment, the memory cell to which the forming voltage is applied or the memory cell to which the adjusted forming voltage is applied may operate in the heavy forming mode, has high reliability and is suitable for serving as a one-time programmable memory device. In an exemplary embodiment of the invention, the memory control circuit 110 may perform a reset operation on the memory cell 122 operating in the heavy forming mode, so as to enable the memory cell 122 to serve as a multiple-time programmable memory device. At least one exemplary embodiment is mentioned below to illustrate an operating method of a resistive memory storage apparatus.

Figure 6:
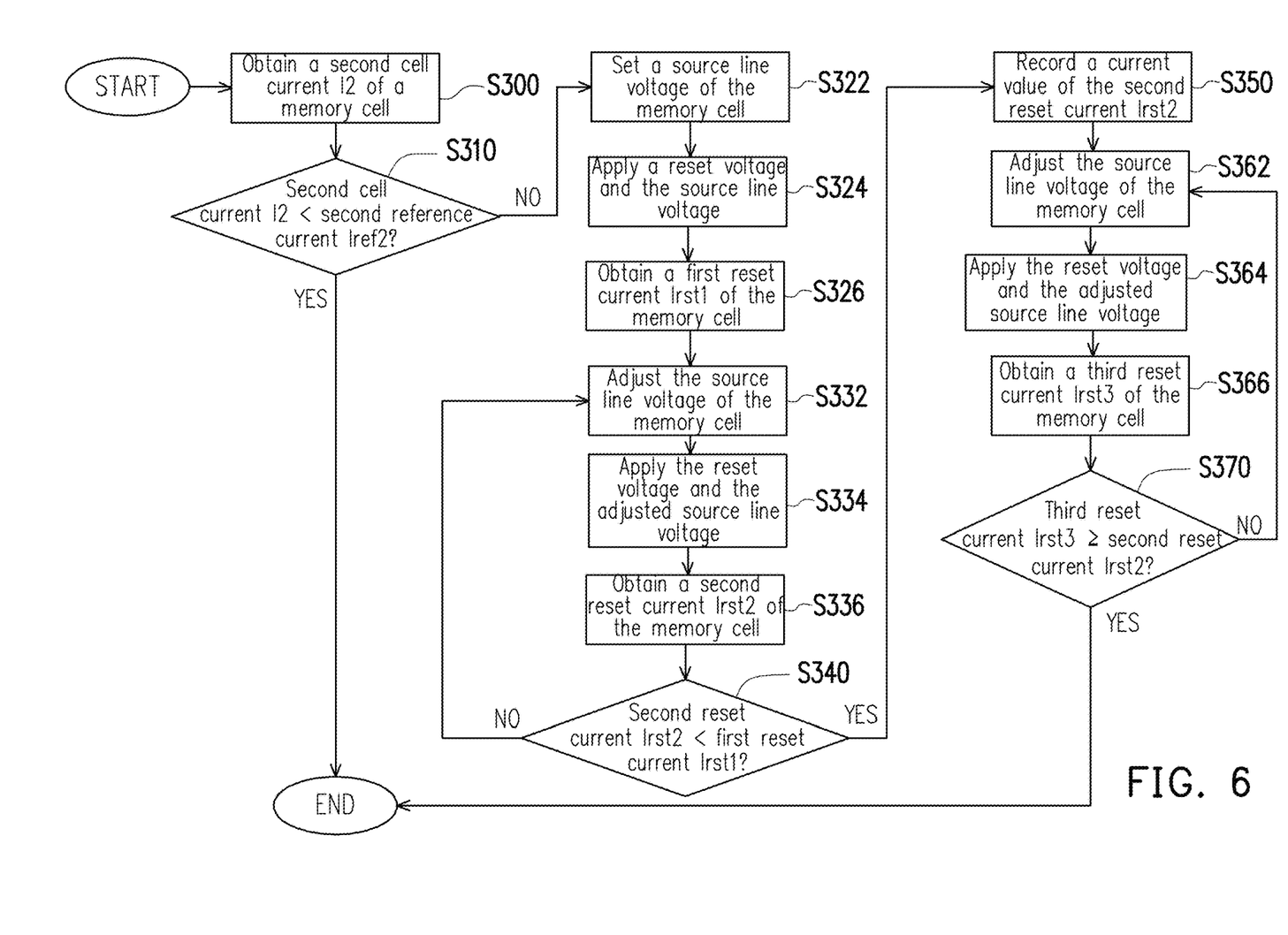
FIG. 6 illustrates a flowchart of an operating method of a memory storage apparatus according to another embodiment of the invention.

FIG. 6 illustrates a flowchart of an operating method of a memory storage apparatus according to another embodiment of the invention. Referring to FIG. 1 and FIG. 6, in the present embodiment, the memory cell 122, for example, may operate in the heavy forming mode, has high reliability and is suitable for serving as a one-time programmable memory device. In the operating method of the present embodiment, the reset operation may be performed on the memory cell 122 operating in the heavy forming mode, so as to enable the memory cell 122 to serve as a multiple-time programmable memory device.

In step S300, the memory control circuit 110 obtains a second cell current I2 of the memory cell 122. In step S310, the memory control circuit 110 determines whether the second cell current I2 is smaller than a second reference current Iref2. If the second cell current I2 is smaller than the second reference current Iref2 (i.e., I2<Iref2), the memory control circuit 110 does not perform the reset operation on the memory cell 122 operating in the heavy forming mode and ends the operating method. If the second cell current I2 is greater than or equal to the second reference current Iref2, the memory control circuit 110 performs step S322 to perform the reset operation on the memory cell 122 operating in the heavy forming mode. Therefore, in step S310, the memory control circuit 110 determines whether to perform the reset operation on the memory cell 122 operating in the heavy forming mode according to a magnitude relationship between the second cell current I2 and the second reference current Iref2.

In step S322, the memory control circuit 110 sets a source line voltage of the memory cell 122. In step S324, the memory control circuit 110 applies a reset voltage and the source line voltage respectively to the gate of the memory cell 122 and a source line coupled to the gate of the memory cell 122. In step S326, the memory control circuit 110 obtains a first reset current Irst1 of the memory cell 122 and records a first reset current value. In step S332, the memory control circuit 110 adjusts the source line voltage of the memory cell 122. In step S334, the memory control circuit 110 applies the reset voltage and the adjusted source line voltage respectively to the gate of the memory cell 122 and the source line coupled to the gate of the memory cell 122. In step S336, the memory control circuit 110 obtains a second reset current Irst2 of the memory cell 122.

In step S340, the memory control circuit 110 determines whether the second reset current Irst2 is smaller than the first reset current Irst1. If the second reset current Irst2 is smaller than the first reset current Irst1 (i.e., Irst2<Irst1), the memory control circuit 110 performs step S350 to record a current value of the second reset current Irst2. If the second reset current Irst2 is equal to the first reset current Irst1 (i.e., Irst2=Irst1), the memory control circuit 110 repeats steps S332 to S340 until the second reset current Irst2 becomes smaller than the first reset current Irst1. Therefore, in step S340, the memory control circuit 110 determines whether to adjust the source line voltage of the memory cell 122 again or record the current value of the second reset current Irst2 according to a magnitude relationship between the first reset current Irst1 and the second reset current Irst2.

In step S362, the memory control circuit 110 adjusts the source line voltage of the memory cell 122. In step S364, the memory control circuit 110 applies the reset voltage and the adjusted source line voltage respectively to the gate of the memory cell 122 and the source line coupled to the gate of the memory cell 122. In step S366, the memory control circuit 110 obtains a third reset current Irst3 of the memory cell 122. In step S370, the memory control circuit 110 determines whether the third reset current Irst3 is greater than or equal to the second reset current Irst2. If the third reset current Irst3 is greater than or equal to the second reset current Irst2 (i.e., Irst3≥Irst2), the memory control circuit 110 ends the reset operation. If the third reset current Irst3 is smaller than the second reset current Irst2 (i.e., Irst3<Irst2), the memory control circuit 110 repeats steps S362 to S370 until the third reset current Irst3 becomes greater than or equal to the second reset current Irst2.

In the present embodiment, methods of obtaining the cell current or reset current of the memory cell 122 include, for example, applying a read voltage or a verification voltage to the memory cell 122 so as to detect the magnitude of the current value of the memory cell 122. In the present embodiment, methods of adjusting the reset voltage by the memory control circuit 110 include, for example, stepping the reset voltage, i.e., adjusting the reset voltage into a pulse width signal having a gradually increasing level. In the present embodiment, by the operating method as illustrated in FIG. 6, the memory control circuit 110 may perform the reset operation on the memory cell 122 operating in the heavy forming mode, so as to enable the memory cell 122 to serve as a multiple-time programmable memory device.

In summary, in an exemplary embodiment of the invention, the memory cell to which a greater forming voltage as compared to the forming voltage in the normal forming procedure is applied or the memory cell to which an adjusted greater forming voltage is applied in the heavy forming procedure may operate in the heavy forming mode, has high reliability and is suitable for serving as a one-time programmable memory device. In addition, the memory control circuit may perform the reset operation on the memory cell operating in the heavy forming mode, so as to enable the memory cell to serve as a multiple-time programmable memory device. Such operating manner may maintain the high temperature data retention of a memory storage apparatus operating in the heavy forming mode and optimize the endurance of the memory storage apparatus operating in the heavy forming mode, thus improving the reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An operating method of a resistive memory storage apparatus, comprising:
   applying a forming voltage to a memory cell and obtaining a first cell current of the memory cell; and
   determining whether to adjust the forming voltage and apply the adjusted forming voltage to the memory cell according to a magnitude relationship between the first cell current and a first reference current, wherein the memory cell to which the forming voltage is applied operates in a heavy forming mode and serves as a one-time programmable memory device.

2. The operating method of the resistive memory storage apparatus according to claim 1, further comprising:
   determining whether the first cell current is smaller than the first reference current;
   if the first cell current is smaller than the first reference current, adjusting the forming voltage and applying the adjusted forming voltage to the memory cell; and
   if the first cell current is greater than or equal to the first reference current, ending the operating method.

3. The operating method of the resistive memory storage apparatus according to claim 1, further comprising:
   repeating adjusting the forming voltage and applying the adjusted forming voltage to the memory cell until the first cell current becomes greater than or equal to the first reference current.

4. The operating method of the resistive memory storage apparatus according to claim 1, wherein the forming voltage comprises a gate voltage and a bit line voltage, and applying the forming voltage to the memory cell comprises:
   applying the gate voltage and the bit line voltage respectively to a gate of the memory cell and a bit line coupled to the gate of the memory cell, wherein voltage values of the gate voltage and the bit line voltage are determined according to a material of a dielectric layer of the memory cell.

5. The operating method of the resistive memory storage apparatus according to claim 1, further comprising:
   performing a reset operation on the memory cell operating in the heavy forming mode, wherein the memory cell on which the reset operation has been performed operates in the heavy forming mode and serves as a multiple-time programmable memory device.

6. The operating method of the resistive memory storage apparatus according to claim 5, further comprising:
   obtaining a second cell current of the memory cell; and
   determining whether to perform the reset operation on the memory cell operating in the heavy forming mode according to a magnitude relationship between the second cell current and a second reference current,
   wherein determining whether to perform the reset operation on the memory cell operating in the heavy forming mode according to the magnitude relationship between the second cell current and the second reference current comprises: determining whether the second cell current is smaller than the second reference current; if the second cell current is smaller than the second reference current, not performing the reset operation on the memory cell operating in the heavy forming mode and ending the operating method; and, if the second cell current is greater than or equal to the second reference current, performing the reset operation on the memory cell operating in the heavy forming mode.

7. The operating method of the resistive memory storage apparatus according to claim 5, wherein the reset operation comprises:
   setting a source line voltage of the memory cell, applying a reset voltage and the source line voltage respectively to a gate of the memory cell and a source line coupled to the gate of the memory cell, and obtaining a first reset current of the memory cell;
   adjusting the source line voltage of the memory cell, applying the reset voltage and the adjusted source line voltage respectively to the gate of the memory cell and the source line coupled to the gate of the memory cell, and obtaining a second reset current of the memory cell; and
   determining whether to adjust the source line voltage of the memory cell again or record a current value of the second reset current according to a magnitude relationship between the first reset current and the second reset current,
   wherein determining whether to adjust the source line voltage of the memory cell again or record the current value of the second reset current according to the magnitude relationship between the first reset current and the second reset current comprises: determining whether the second reset current is smaller than the first reset current; if the second reset current is smaller than the first reset current, recording the current value of the second reset current; and, if the second reset current is equal to the first reset current, adjusting the source line voltage of the memory cell again.

8. The operating method of the resistive memory storage apparatus according to claim 7, further comprising:
   if the second reset current is equal to the first reset current, adjusting the source line voltage of the memory cell again, and repeating applying the reset voltage and the adjusted source line voltage respectively to the gate of the memory cell and the source line coupled to the gate of the memory cell until the second reset current becomes smaller than the first reset current.

9. The operating method of the resistive memory storage apparatus according to claim 7, further comprising:
- after recording the current value of the second reset current, adjusting the source line voltage of the memory cell again, applying the reset voltage and the adjusted source line voltage respectively to the gate of the memory cell and the source line coupled to the gate of the memory cell, and obtaining a third reset current of the memory cell; and
- determining whether to adjust the source line voltage of the memory cell again or end the reset operation according to a magnitude relationship between the second reset current and the third reset current,
- wherein determining whether to adjust the source line voltage of the memory cell again or end the reset operation according to the magnitude relationship between the second reset current and the third reset current comprises: determining whether the third reset current is greater than or equal to the second reset current; if the third reset current is greater than or equal to the second reset current, ending the reset operation; and, if the third reset current is smaller than the second reset current, adjusting the source line voltage of the memory cell again.

10. The operating method of the resistive memory storage apparatus according to claim 9, further comprising:
- if the third reset current is smaller than the second reset current, adjusting the source line voltage of the memory cell again, and repeating applying the reset voltage and the adjusted source line voltage respectively to the gate of the memory cell and the source line coupled to the gate of the memory cell until the third reset current becomes greater than or equal to the second reset current.

* * * * *